US 8,228,084 B1

United States Patent
Chen

(10) Patent No.: US 8,228,084 B1
(45) Date of Patent: Jul. 24, 2012

(54) SYSTEMS AND METHODS FOR SELF-TESTING OF INTEGRATED DEVICES DURING PRODUCTION

(75) Inventor: Hungchi Chen, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 315 days.

(21) Appl. No.: 12/569,097

(22) Filed: Sep. 29, 2009

(51) Int. Cl.
*G01R 31/3187* (2006.01)

(52) U.S. Cl. ............ 324/750.3; 324/750.1; 324/762.01; 702/119; 702/124

(58) Field of Classification Search ............. 324/750.01, 324/759.01
See application file for complete search history.

(56) References Cited

U.S. PATENT DOCUMENTS

| | | | | |
|---|---|---|---|---|
| 6,134,685 | A * | 10/2000 | Spano | 714/724 |
| 6,611,469 | B2 * | 8/2003 | Williams et al. | 365/221 |
| 6,784,686 | B2 * | 8/2004 | Nishida et al. | 324/750.3 |
| 6,894,945 | B2 * | 5/2005 | Sawada | 365/233.11 |
| 7,155,370 | B2 * | 12/2006 | Nejedlo | 702/186 |
| 7,353,156 | B2 * | 4/2008 | Devins et al. | 703/14 |
| 7,486,096 | B2 * | 2/2009 | Dhong et al. | 324/750.3 |
| 7,590,509 | B2 * | 9/2009 | Riedlinger et al. | 702/182 |
| 7,940,066 | B2 * | 5/2011 | Jarboe et al. | 324/750.3 |
| 7,969,168 | B1 * | 6/2011 | Lin et al. | 324/750.3 |
| 8,035,407 | B2 * | 10/2011 | Jarboe et al. | 324/750.3 |
| 2001/0011904 | A1 * | 8/2001 | Kaiser et al. | 324/765 |
| 2010/0164527 | A1 * | 7/2010 | Weyh et al. | 324/763 |

* cited by examiner

*Primary Examiner* — Richard Isla Rodas

(57) ABSTRACT

Embodiments of the present disclosure provide a method that includes producing an integrated circuit device configured to include a system on a chip (SOC) and accessing test code within the SOC during the producing. The method further includes self-testing the integrated circuit device with the test code.

13 Claims, 5 Drawing Sheets

SYSTEMS AND METHODS FOR SELF-TESTING OF INTEGRATED DEVICES DURING PRODUCTION

TECHNICAL FIELD

Embodiments of the present disclosure relate to integrated circuit devices, and more particularly, to the production and testing of the integrated circuit devices.

BACKGROUND

In the current state of integrated circuit (IC) technology, an IC device will often be tested for defects to ensure the quality and reliability of the IC device. As part of such testing, the IC devices, also referred to as "devices under test" (DUT), may be subject to various test patterns and the DUT's response to the test patterns often under various operating conditions, may determine whether the DUT passes or fails the testing.

Often, the testing is performed by automatic test equipment (ATE) which may require pins to be actually inserted into the IC device. Such procedures can be time-consuming and expensive.

The description in this section is related art, and does not necessarily include information disclosed under 37 C.F.R. 1.97 and 37 C.F.R. 1.98. Unless specifically denoted as prior art, it is not admitted that any description of related art is prior art.

SUMMARY

The present disclosure provides a method that includes producing an integrated circuit device configured to include a system on a chip (SOC) and accessing test code within the SOC during the producing. The method further includes self-testing the integrated circuit device with the test code.

The present disclosure also provides an apparatus that includes a system on a chip (SOC) including a processor and memory, and test code stored within the memory of the SOC, the test code for use during a self-test the apparatus during production of the apparatus.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe systems and methods related to the production and testing of integrated circuit devices. In the following detailed description, reference is made to the accompanying drawings which form a part hereof, wherein like numerals designate like parts throughout. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The description uses perspective-based descriptions such as up/down, back/front, over/under, and top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms chip, die, integrated circuit, integrated circuit device, monolithic device, semiconductor device, and microelectronic device are often used interchangeably in the microelectronics field. The present invention is applicable to all of the above as they are generally understood in the field.

Figure 1:
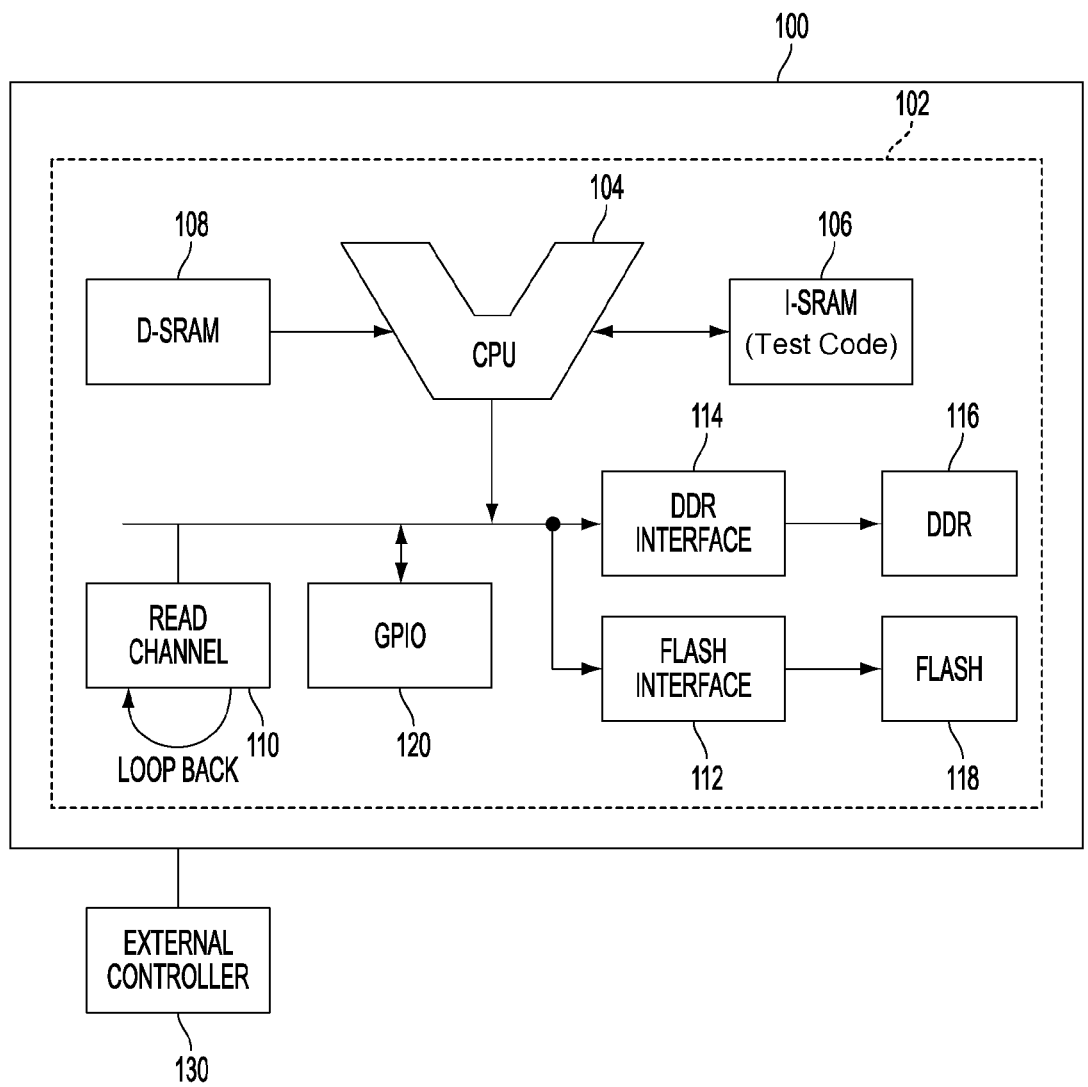
FIG. 1 is a schematic illustration of an integrated circuit (IC) device operatively coupled to an external controller.

FIG. 1 illustrates a schematic diagram of an integrated circuit (IC) device 100. The IC device 100 is illustrated as being configured with a system on a chip (SOC) 102. In general, the IC device may include multiple SOCs 102. Additionally, the SOC illustrated in FIG. 1 may include additional components as well as multiple components of the same type that are illustrated. For clarity, a single SOC with only a few single components is illustrated.

The SOC 102 includes a processor or central processing unit (CPU) 104, an instruction static random access memory (I-SRAM) 106, and a dynamic static random access memory (D-SRAM) 108. The SOC 102 further includes a read channel 110, a flash interface 112, and a DDR interface 114. The DDR interface 114 communicates with a DDR 116 while the flash interface 112 communicates with a flash memory 118. In one embodiment, the SOC 102 further includes generic purpose input/output (GPIO) pins 120.

In one embodiment, the I-SRAM 106 includes test code. The test code can be loaded into the I-SRAM 106 during production of the IC device 100. When the IC device 100 is ready to for self-testing during the final phases of production, the test code is loaded from the I-SRAM 106 into the CPU 104. The CPU 104 then executes the test code to thereby run one or more tests on the completed IC device 100 during the final phases of production. The self-testing is initiated by an external controller 130, which is generally a computing type device such as, for example, a personal computer, that is operated by a user.

In accordance with various embodiments, the SOC 102 includes four GPIO pins 120. During the self-testing process, one of the four pins is utilized as a reset pin, which an external controller 130 uses to reset the IC device 100 in order to begin self-testing. Another GPIO pin 120 is used as a status pin, which is used to provide the status of the IC device 100 to the external controller 130. For example, the status pin can let the external controller 130 know that the IC device 100 is ready for self-testing, is in the process of self-testing or is finished with the self-testing. One of the GPIO pins is used to provide data (results of the self-testing) to the external controller 130. Another GPIO pin is used as an acknowledgement pin with which the external controller 130 communicates with the IC device 100 to inform the IC device 100 that the test results have been received by the external controller 130.

Figure 2:
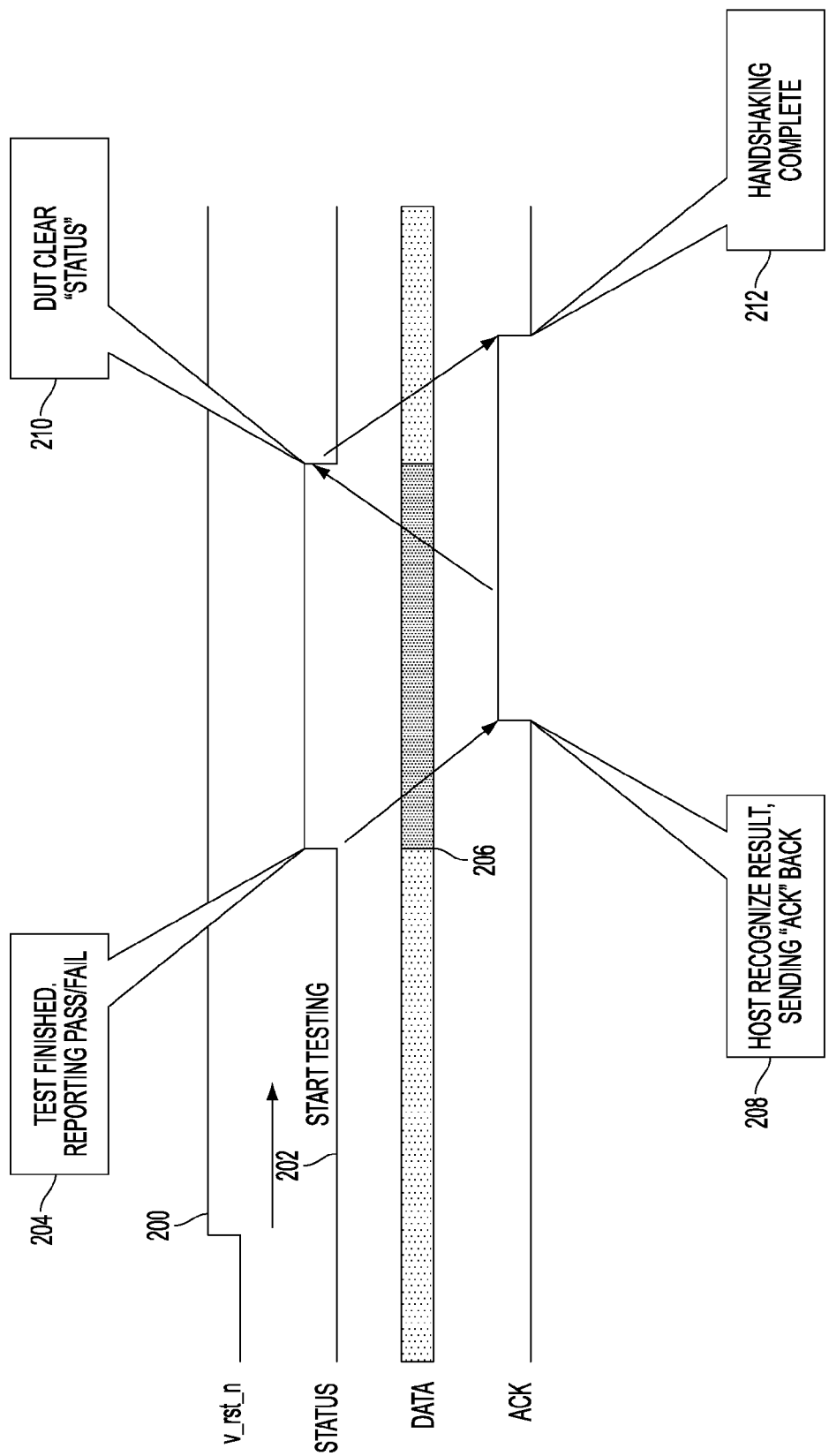
FIG. 2 is an operation diagram for generic purpose input/output (GPIO) pins of the IC device of FIG. 1.

FIG. 2 provides an example of operation of the four GPIO pins during the self-testing for the IC device 100 as a device under test (DUT). FIG. 2 illustrates four signals—v rst n (reset), STATUS, DATA, and ACK (acknowledgment)—respectively received at the four GPIO pins. At 200, the reset pin goes high in order to reset the IC device 100 for self-testing. At 202, the status pin then indicates that the IC device 100 is self-testing by, for example, the status pin being low and the reset pin having gone high. At 204, when the self-testing is completed, the status pin may so indicate by going high. At 206, the test results are provided to the external controller 130 via the results pin. At 208, the external controller 130 then communicates with the IC device 100 to indicate that the test results are being received by sending an acknowledgement via the acknowledgement pin. Once receipt of the test results by the external controller 130 is complete and receipt is acknowledged, the IC device 100 status pin is cleared by going low. The acknowledgement pin then goes low thereby indicating that the handshaking between the IC device 100 and the external controller 130 is complete.

Figure 3:
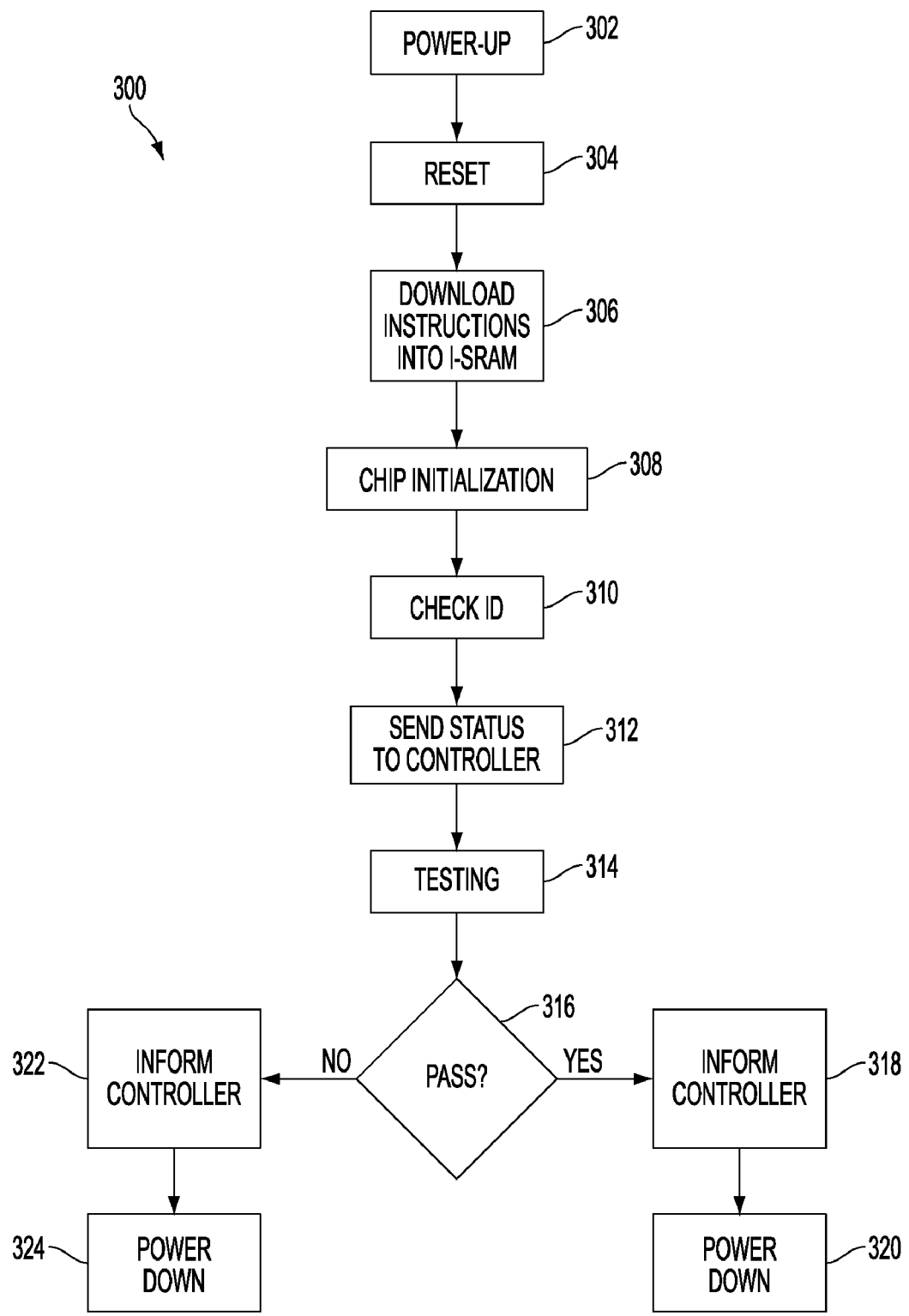
FIG. 3 is a flow chart illustrating a method of self-testing of the IC device of FIG. 1.

FIG. 3 illustrates one implementation of a method 300 for performing a self-test on an IC device (e.g., the IC device 100 of FIG. 1). At 302, the method 300 begins with a power-up of the IC device 100. At 304, the IC device 100 is reset in order to enter a testing mode. At 306, instructions for the test are downloaded from the I-SRAM 106 into the CPU 104. At 308, the IC device 100 is initialized and at 310, the identification of the IC device 100 is determined. At 312, the status of the IC device 100 is provided to the external controller 130. At 314, the CPU 104 begins self-testing. The self-testing generally includes operating and testing the IC device 100 at a minimum voltage, a nominal voltage, and a maximum voltage. The nominal voltage is generally within plus or minus five percent of the minimum and maximum voltages. Examples of self-testing that may be performed include DDR testing, DLL Window Search and report, Shadow RAM solution calculation, Flash testing, SOC testing and Read Channel Loop Back testing. At 316, upon completion of the self-testing, the IC device 100 it is determined whether or not the IC device 100 passes. At 318 and 322, the IC device 100 provides the test results via a GPIO pin to the external controller 130, which, as previously discussed, acknowledges receipt of the results. At 320 and 324, the IC device is powered down.

Figure 4:
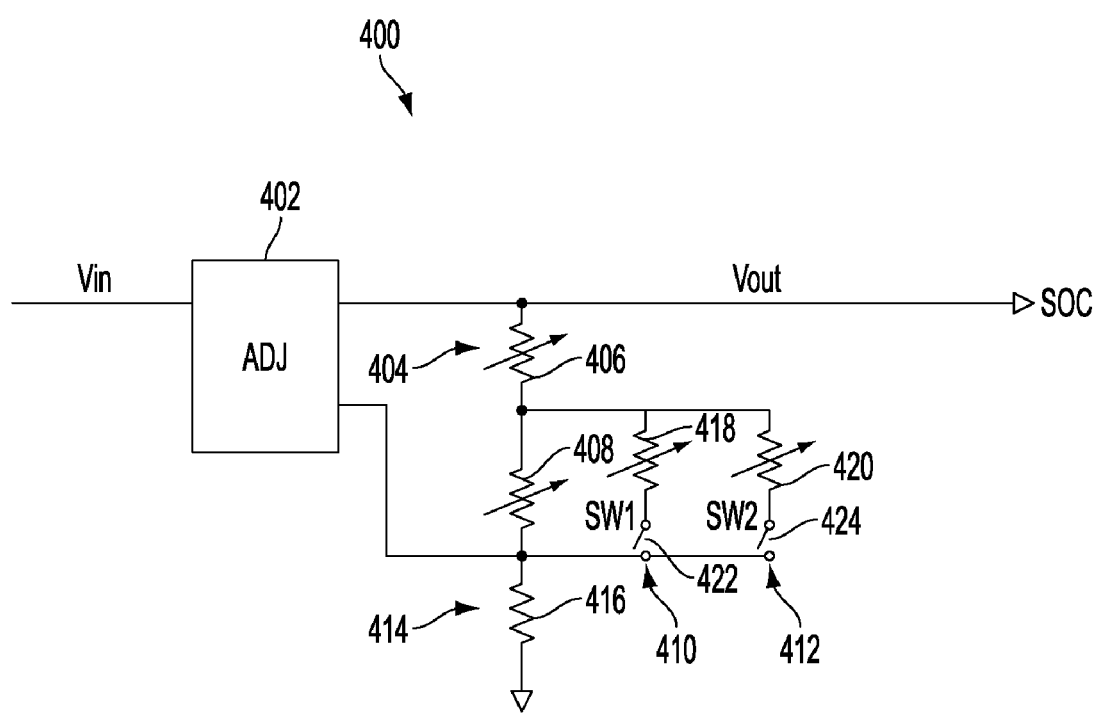
FIG. 4 is a schematic illustration of a power circuit for providing power during self-testing of the IC device of FIG. 1.

FIG. 4 illustrates a circuit 400 for providing power to an IC device 100 and SOC 102 during self-testing. The circuit 400 includes a regulator 402 and a resistor branch 404. The resistor branch 404 includes two variable resistors, 406 and 408. Two shorting branches 410 and 412 are also provided. A ground branch 414 that includes a resistor 416 is also provided. The shorting branches 410 and 412 each include a variable resistor 418, 420 and a switch 422, 424, respectively.

The circuit 400 is useful for providing three levels of a voltage (Vout) to the SOC 102. When both switches 422 and 424 are open, then the maximum voltage (Vmax) is provided to the SOC 102 as Vout. When both switches 422 and 424 are closed, then a minimum voltage (Vmin) is provided as Vout to the SOC 102. Finally, when only one switch 422 is closed and the other switch 424 is open, then a nominal voltage (Vnom) is provided as Vout to the SOC 102. Such an arrangement allows for three different voltages to be provided to the IC device 100 and SOC 102 for various self-testing purposes. GPIO pins 120 of the IC device 100 are used to open and close the switches 422 and 424. Such an arrangement prevents loss of power to the SOC 102 since the circuit 400 cannot short-out.

Figure 5:
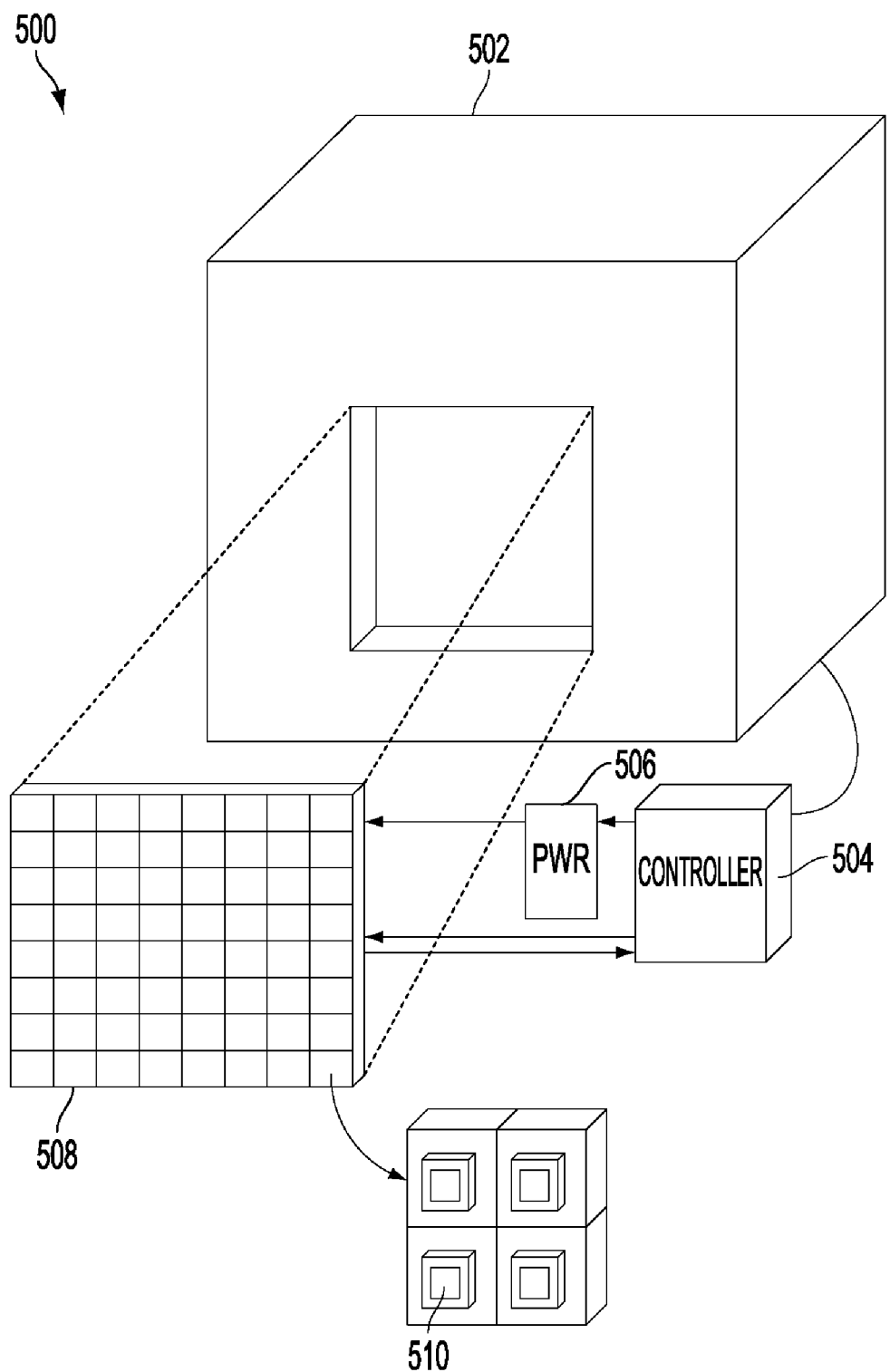
FIG. 5 is a schematic illustration of an arrangement for self-testing of multiple IC devices.

FIG. 5 schematically illustrates an arrangement 500 for self-testing of multiple IC devices 100. The arrangement includes a handler 502, an external controller 504, (generally in the form of a personal computer (PC) and similar to external controller 130 as previously described), a power supply 506 and a printed circuit board (PCB) socket board 108 for placement of IC devices 100 as DUTs into out sockets 510 of the PCB socket board 508.

The handler 502 is generally a robotic arm that places multiple IC devices 100 into the PCB socket board 508 and is generally known in the art. Generally, the handler 502 and PCB socket board 508 are configured to handle 256, 512, 1,024, etc., DUTs at a time.

Once the socket board 508 has been loaded with DUTs, self-testing of the DUTs may begin as has been previously described. Power is provided from the power supply 506, which may include a circuit 400 as previously described with respect to FIG. 4. The power is provided to the DUT. As the self-testing is done for each DUT and the results are reported to the external controller 504, the handler 502 may move the DUTs based upon the test results. The IC devices 100 that pass may be binned into lots for DUTs that have passed, while DUTs that have failed may be binned into lots as IC devices 100 that have failed. After IC devices 100 are removed, they may be replaced by the handler 502 with new IC devices 100 to be tested.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A method for testing an integrated circuit device including a system on a chip, wherein the system on a chip includes a plurality of generic purpose input/output pins, the method comprising:

storing test code within the system on a chip, the test code being stored within the system on a chip during production of the integrated circuit device; and during a latter phase of production of the integrated circuit device, performing a self-test on the integrated circuit device, wherein performing the self-test on the integrated circuit device includes receiving, at a first generic purpose input/output pin of the plurality of generic purpose input/output pins, a reset signal to reset the integrated circuit device, wherein the reset signal is provided by a controller external to the integrated circuit device,
subsequent to the integrated circuit device being reset,
(i) executing the test code stored within the system on the chip to test the integrated circuit device, and
(ii) providing, at a second generic purpose input/output pin of the plurality of generic purpose input/output pins, a status signal to the controller external to the integrated circuit device, wherein the status signal indicates that the self-test is being performed on the integrated circuit device, and
subsequent to completion of the test,
(i) providing, via a third generic purpose input/output pin of the plurality of generic purpose input/output pins, a result of the test to the controller external to the integrated circuit device, and
(ii) receiving, at a fourth generic purpose input/output pin of the plurality of generic purpose input/output pins, an acknowledgement signal from the controller external to the integrated circuit device, wherein the acknowledgement signal indicates receipt of the test result by the controller external to the integrated circuit device,
wherein performing the self-test on the integrated circuit device comprises providing three distinct voltage levels to the system on a chip, and
wherein the three distinct voltage levels include (i) a minimum voltage, (ii) a nominal voltage, and (iii) a maximum voltage, wherein the nominal voltage is within plus or minus five percent of each of the minimum voltage and the maximum voltage.

2. The method of claim 1, wherein storing test code within the system on a chip comprises storing the test code into an instruction static random access memory (I-SRAM) of the system on a chip.

3. The method of claim 1, further comprising receiving power to provide the three distinct voltage levels.

4. The method of claim 1, further comprising:
loading multiple integrated circuit devices into a socket board; and
simultaneously performing the self-test of the multiple integrated circuit devices.

5. An integrated circuit device comprising:
a system on a chip including (i) a processor, (ii) a plurality of generic purpose input/output pins, and (iii) memory; and
test code stored, during production of the integrated circuit device, within the memory of the system on a chip,
wherein the test code is used during a self-test of the integrated circuit device during a latter phase of production of the apparatus,
wherein during the self-test of the integrated device,
at a first generic purpose input/output pin of the plurality of generic purpose input/output pins, a reset signal is received to reset the integrated circuit device, wherein the reset signal is provided by a controller external to the integrated circuit device,
subsequent to the integrated circuit device being reset,
(i) the test code stored within the system on the chip is executed to test the integrated circuit device, and
(ii) at a second generic purpose input/output pin of the plurality of generic purpose input/output pins, a status signal is provided to the controller external to the integrated circuit device, wherein the status signal indicates that the self-test is being performed on the integrated circuit device, and
subsequent to completion of the test,
(i) via a third generic purpose input/output pin of the plurality of generic purpose input/output pins, a result of the test is provided to the controller external to the integrated circuit device, and
(ii) at a fourth generic purpose input/output pin of the plurality of generic purpose input/output pins, an acknowledgement signal is received from the controller external to the integrated circuit device, wherein the acknowledgement signal indicates receipt of the test result by the controller external to the integrated circuit device,
wherein the self-test comprises providing three distinct voltage levels to the system on a chip, and
wherein the three distinct voltage levels include (i) a minimum voltage, (ii) a nominal voltage, and (iii) a maximum voltage, wherein the nominal voltage is within plus or minus five percent of each of the minimum voltage and the maximum voltage.

6. The integrated circuit device of claim 5, wherein:
the memory is static random access memory; and
the test code is stored in static random access memory for self-testing.

7. The integrated circuit device of claim 5, wherein the integrated circuit device is configured to receive power to provide the three distinct voltage levels.

8. A system comprising:
an external controller;
an integrated circuit device coupled to the external controller, the integrated circuit device comprising a system on a chip, the system on a chip comprising
a processor,
a plurality of generic input/output pins,
a memory, and
test code stored within the memory of the system on a chip,
wherein the test code is used during a self-test of the integrated circuit device during a latter stage of production of the integrated circuit device,
wherein during the self-test of the integrated device,
at a first generic purpose input/output pin of the plurality of generic purpose input/output pins, a reset signal is received to reset the integrated circuit device, wherein the reset signal is provided by a controller external to the integrated circuit device,
subsequent to the integrated circuit device being reset,
(i) the test code stored within the system on the chip is executed to test the integrated circuit device, and
(ii) at a second generic purpose input/output pin of the plurality of generic purpose input/output pins, a status signal is provided to the controller external to the integrated circuit device, wherein the status signal indicates that the self-test is being performed on the integrated circuit device, and
subsequent to completion of the test,
(i) via a third generic purpose input/output pin of the plurality of generic purpose input/output pins, a result of the test is provided to the controller external to the integrated circuit device, and
(ii) at a fourth generic purpose input/output pin of the plurality of generic purpose input/output pins, an acknowledgement signal is received from the controller external to the integrated circuit device, wherein the acknowledgement signal indicates receipt of the test result by the controller external to the integrated circuit device,
wherein the self-test comprises providing three distinct voltage levels to the system on a chip, and wherein the three distinct voltage levels include (i) a minimum voltage, (ii) a nominal voltage, and (iii) a maximum voltage, wherein the nominal voltage is within plus or minus five percent of each of the minimum voltage and the maximum voltage.

9. The system of claim 8, further comprising a socket board configured to receive multiple integrated circuit devices, wherein the socket board is coupled to the external controller.

10. The system of claim 9, further comprising a handler configured to (i) load and (ii) unload integrated circuit devices in the socket board.

11. The system of claim 9, wherein the socket board is further configured to allow simultaneous performance of the self-test of the multiple integrated circuit devices.

12. The system of claim 8, wherein the integrated circuit device is configured to receive power to provide the three distinct voltage levels.

13. The system of claim 8, wherein:
the memory is static random access memory; and
the test code is stored in the static random access memory for self-testing.

* * * * *